United States Patent
Harada et al.

(10) Patent No.: US 11,762,044 B2
(45) Date of Patent: *Sep. 19, 2023

(54) MAGNETIC SENSOR

(71) Applicant: TDK Corporation, Tokyo (JP)

(72) Inventors: Kentaro Harada, Tokyo (JP); Tsuyoshi Umehara, Tokyo (JP); Kenichi Takano, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/852,956

(22) Filed: Jun. 29, 2022

(65) Prior Publication Data

US 2022/0334201 A1    Oct. 20, 2022

Related U.S. Application Data

(63) Continuation of application No. 17/036,104, filed on Sep. 29, 2020, now Pat. No. 11,408,950.

(30) Foreign Application Priority Data

Oct. 24, 2019 (JP) ................................ 2019-193474

(51) Int. Cl.
    *G01R 33/09*    (2006.01)
(52) U.S. Cl.
    CPC ......... *G01R 33/098* (2013.01); *G01R 33/091* (2013.01)
(58) Field of Classification Search
    CPC .......................... G01R 33/098; G01R 33/091
    See application file for complete search history.

(56) References Cited

U.S. PATENT DOCUMENTS

| | | |
|---|---|---|
| 2016/0313122 A1 | 10/2016 | Bhattacharyya et al. |
| 2016/0327616 A1 | 11/2016 | Deak |
| 2018/0172781 A1 | 6/2018 | Ohta et al. |

FOREIGN PATENT DOCUMENTS

| | | |
|---|---|---|
| JP | 2017-502298 A | 1/2017 |
| WO | 2019139110 A1 | 7/2019 |

OTHER PUBLICATIONS

English Machine Translation of Office Action dated Oct. 5, 2021, issued in corresponding JP Patent Application No. 2019-193474.

*Primary Examiner* — Minh Q Phan
(74) *Attorney, Agent, or Firm* — POSZ LAW GROUP, PLC

(57) ABSTRACT

A magnetic sensor is provided that can attenuate a magnetic field in a direction that is perpendicular to the magnetic field detecting direction at a higher rate than the magnetic field in the magnetic field detecting direction.

Magnetic sensor 1 has: first soft magnetic layer 3; a pair of second soft magnetic layers 4A, 4B that is positioned at a location that is different from first soft magnetic layer 3 in the Z direction of first soft magnetic layer 3; and magnetic field detecting element 2 that is positioned between first soft magnetic layer 3 and second soft magnetic layers 4A, 4B in the Z direction, wherein magnetic field detecting element 2 has a magnetic field detecting direction that is parallel to a direction in which the pair of second soft magnetic layers 4A, 4B is arranged. As viewed in the Z direction, second soft magnetic layers 4A, 4B are positioned on both sides of a center of first soft magnetic layer 3, and magnetic field detecting element 2 is positioned inside of a periphery of first soft magnetic layer 3.

11 Claims, 7 Drawing Sheets

MAGNETIC SENSOR

FIELD OF THE INVENTION

The present application is a continuation application of U.S. application Ser. No. 17/036,104 filed on Sep. 29, 2020, which is based on, and claims priority from, JP Application No. 2019-193474, filed on Oct. 24, 2019, the disclosures of which are hereby incorporated by reference.

The present invention relates to a magnetic sensor.

BACKGROUND OF THE INVENTION

A magnetic sensor detects a magnetic field in a specific direction (a magnetic field detecting direction). A magnetic sensor has a magnetic field detecting element. Since a magnetic field detecting element that uses magnetoresistive effect, which is typically a TMR element, is highly likely to be magnetically saturated when a large magnetic field is detected, a shield structure for attenuating the magnetic field may be provided in the vicinity of the magnetic field detecting element. JP 2017-502298 discloses a magnetic sensor in which attenuators are provided in the vicinity of detecting elements and in which shields are provided in the vicinity of reference elements. The attenuators and the shields are formed of a soft magnetic material etc., and are alternately arranged in the magnetic field detecting direction on the same plane. The detecting elements are provided immediately below the attenuators, and the reference elements are provided immediately below the shields. That is, the detecting elements and the reference elements are provided on the same side of the attenuators and the shields.

SUMMARY OF THE INVENTION

It is desired that a magnetic sensor only detect a magnetic field in the magnetic field detecting direction, but an external magnetic field usually contains components in directions other than the magnetic field detecting direction. Components of a magnetic field in directions other than the magnetic field detecting direction are a source of noise for the magnetic sensor and reduce the S/N ratio. The magnetic sensor that is described in JP 2017-502298 can attenuate a magnetic field in the magnetic field detecting direction, but JP 2017-502298 is silent about a magnetic field in a direction that is perpendicular to the magnetic field detecting direction.

The present invention aims at providing a magnetic sensor that can attenuate a magnetic field in a direction that is perpendicular to the magnetic field detecting direction at a higher rate than the magnetic field in the magnetic field detecting direction.

A magnetic sensor of the present invention comprises: a first soft magnetic layer; a pair of second soft magnetic layers that is positioned at a location that is different from the first soft magnetic layer in a thickness direction of the first soft magnetic layer; and a magnetic field detecting element that is positioned between the first soft magnetic layer and the second soft magnetic layers in the thickness direction, wherein the magnetic field detecting element has a magnetic field detecting direction that is parallel to a direction in which the pair of the second soft magnetic layers is arranged. As viewed in the thickness direction, the second soft magnetic layers are positioned on both sides of a center of the first soft magnetic layer, and the magnetic field detecting element is positioned inside of a periphery of the first soft magnetic layer.

According to the present invention, it is possible to provide a magnetic sensor that can attenuate a magnetic field in a direction that is perpendicular to the magnetic field detecting direction at a higher rate than the magnetic field in the magnetic field detecting direction.

The above and other objects, features and advantages of the present invention will become apparent from the following description with reference to the accompanying drawings which illustrate examples of the present invention.

DETAILED DESCRIPTION OF THE EMBODIMENTS

Hereinafter, some embodiments of the magnetic sensor of the present invention will be described with reference to the drawings. In the following descriptions and the drawings, the X direction is a direction that is parallel to the magnetic field detecting direction of the magnetic sensor, or a direction that is parallel to the direction in which a pair of second soft magnetic layers is arranged. The Y direction is a direction that is parallel to the edges of the second soft magnetic layers, wherein the edges face each other. The Y direction corresponds to the direction of a biasing magnetic field for the magnetic field detecting element. The Z direction is a direction that is perpendicular both to the X direction and to the Y direction, and corresponds to the thickness direction of the first soft magnetic layer, the second soft magnetic layers and the magnetic field detecting element. A magnetic field in the X direction is a signal magnetic field, and a magnetic field in the Y direction is a magnetic field that is to be blocked.

First Embodiment

Figure 1A:
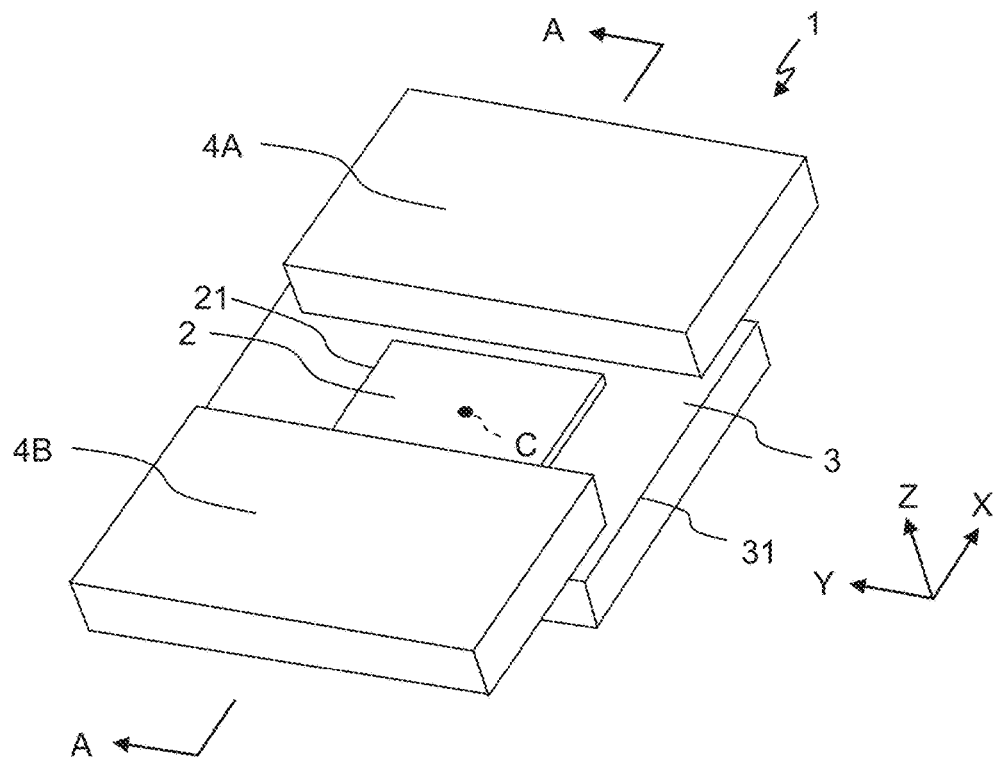
FIG. 1A is a conceptual perspective view of a magnetic sensor according to a first embodiment.
Figure 1B:
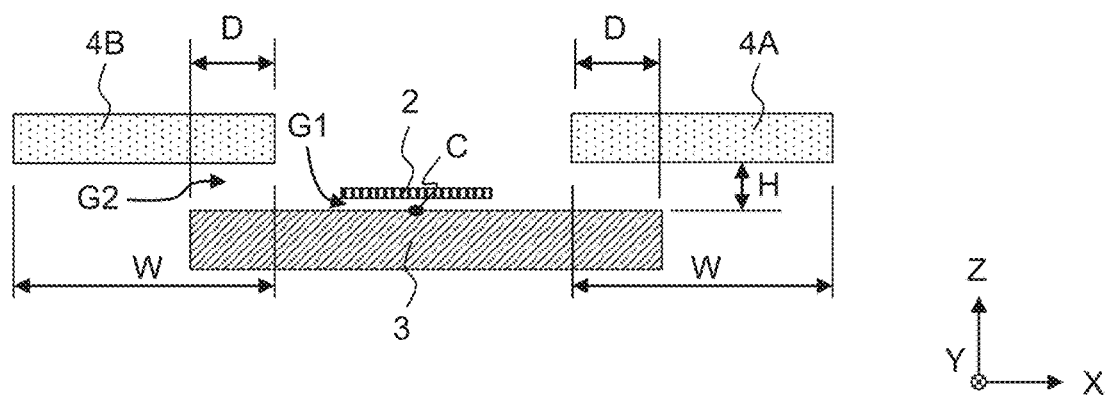
FIG. 1B is a sectional view taken along line A-A in FIG. 1A.

FIGS. 1A, 1B are conceptual views of magnetic sensor 1 according to the first embodiment, wherein FIG. 1A shows a perspective view of magnetic sensor 1, and FIG. 1B shows a cross sectional view taken along line A-A in FIG. 1A.

Magnetic sensor 1 includes magnetic field detecting element 2, first soft magnetic layer 3 and a pair of second soft magnetic layers 4A, 4B. Magnetic field detecting element 2 is composed of a plurality of TMR elements (not illustrated) that are connected in series. When no external magnetic field is present, the magnetization direction of the free layer of each TMR element is directed in the Y direction by a bias magnet (not illustrated). When an external magnetic field (a signal magnetic field) is applied in the X direction, the magnetization direction of the free layer rotates toward the X direction in the X-Y plane depending on the intensity of the external magnetic field, and the electric resistance of the TMR element is changed. Magnetic sensor 1 outputs a voltage that corresponds to the electric resistance, and thereby the intensity of the magnetic field in the X direction is determined.

First soft magnetic layer 3 is a thin film made of a soft magnetic layer, such as perm-alloy (NiFe), and is formed by plating or sputtering. As viewed in the Z direction, first soft magnetic layer 3 is rectangular, and magnetic field detecting element 2 is contained in first soft magnetic layer 3. In other words, as viewed in the Z direction, magnetic field detecting element 2 is positioned inside of periphery 31 of first soft magnetic layer 3, and periphery 21 of magnetic field detecting element 2 does not overlap periphery 31 of first soft magnetic layer 3. The shape of first soft magnetic layer 3, as viewed in the Z direction, may be determined depending on the shape of magnetic field detecting element 2. For example, if magnetic field detecting element 2 has a shape of a bar that is elongate in the Y direction, then first soft magnetic layer 3 may also have a shape of a bar that is elongate in the Y direction. Gap G1 is provided between first soft magnetic layer 3 and magnetic field detecting element 2 in the Z direction.

A pair of second soft magnetic layers 4A, 4B is positioned at a location or a level that is different from that of first soft magnetic layer 3 in the Z direction. Second soft magnetic layers 4A, 4B are provided at the same level in the Z direction. That is, gap G2 is provided between first soft magnetic layer 3 and a pair of second soft magnetic layers 4A, 4B in the Z direction. Magnetic field detecting element 2 is provided between first soft magnetic layer 3 and second soft magnetic layers 4A, 4B in the Z direction. Thus, first soft magnetic layer 3, magnetic field detecting element 2 and a pair of second soft magnetic layers 4A, 4B constitute a three-layered structure, in which these are separated from each other in the Z direction. The space between first soft magnetic layer 3 and magnetic field detecting element 2 and the space between magnetic field detecting element 2 and a pair of second soft magnetic layers 4A, 4B are filled with a non-magnetic material, such as alumina. As viewed in the Z direction (that is, in the X direction), second soft magnetic layer 4A and second soft magnetic layer 4B are positioned on both sides of center C of first soft magnetic layer 3 in the X direction and overlap first soft magnetic layer 3. As viewed in the Z direction (that is, in the X direction), magnetic field detecting element 2 is positioned between second soft magnetic layer 4A and second soft magnetic layer 4B, and is spaced both from second soft magnetic layer 4A and from second soft magnetic layer 4B.

Figure 2A:
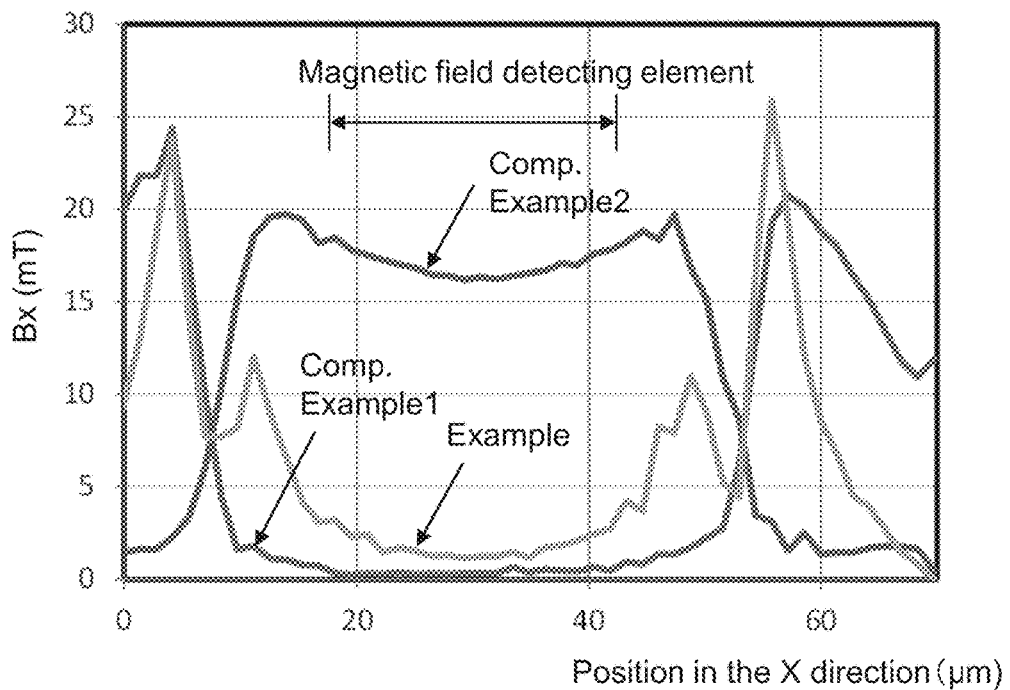
FIGS. 2A and 2B are examples of magnetic flux density when an external magnetic field is applied to the magnetic sensor shown in FIG. 1A.
Figure 2B:
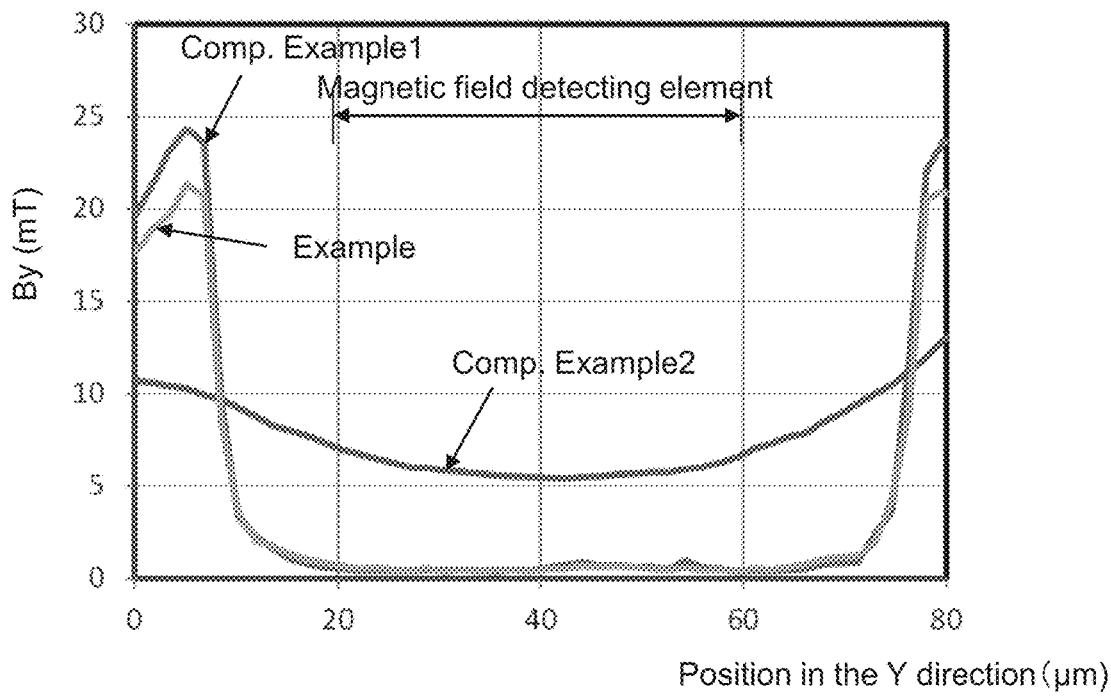

FIG. 2A shows magnetic flux density (Bx) when an external magnetic field having magnetic flux density of 10 mT is applied in the X direction, and FIG. 2B shows magnetic flux density (By) when an external magnetic field having magnetic flux density of 10 mT is applied in the Y direction. Example corresponds to the present embodiment, while only first soft magnetic layer 3 is provided in Comparative Example 1, and only a pair of second soft magnetic layers 4A, 4B is provided in Comparative Example 2. Bx and By are average values in the thickness direction (the Z direction) where magnetic field detecting element 2 is arranged, and the area of magnetic field detecting element 2 in the X direction is depicted in the drawing. In Comparative Example 1, both Bx and By are small in the area of magnetic field detecting element 2. This means that first soft magnetic layer 3 functions as a shield that weakens a magnetic field. In Comparative Example 2, both Bx and By are large in the area of magnetic field detecting element 2. This means that second soft magnetic layers 4A, 4B function as yolks that enhance the magnetic field. Table 1 shows Py/Px, which is the ratio of magnetic field transmittance Py in the Y direction to magnetic field transmittance Px in the X direction. Magnetic field transmittance Px, Py is defined as the ratio of "the magnetic flux density where the magnetic field transmittance is determined" to "the magnetic flux density that would be generated by an external magnetic field if first soft magnetic layer 3 and second soft magnetic layers 4A, 4B were not provided". The rate at which Comparative Example 2 increases relative to Comparative Example 1 is greater in the X direction than in the Y direction. Therefore, Py/Px is smaller in Comparative Example 2 than in Comparative Example 1. Example shows a larger magnetic flux density Bx than Comparative Example 1 in the area of magnetic field detecting element 2. In contrast, magnetic flux density By is almost the same as Comparative Example 1. As a result, Py/Px is smaller than that of Comparative Example 2. Accordingly, Example has a good performance of transmitting a signal magnetic field and of attenuating a magnetic field that is perpendicular to the signal magnetic field, and is resistive to a disturbing magnetic field that is applied from a direction different from the direction in which a signal magnetic field is applied. In addition, since Comparative Example 2 shows large values both for Bx and for By, when a large external magnetic field is applied, the output of magnetic sensor 1 may be saturated and the measurement accuracy may be lowered.

TABLE 1

|  |  | Magnetic field transmittance in the X direction Px (%) | Magnetic field transmittance in the Y direction Px (%) | Py/Px |
| --- | --- | --- | --- | --- |
| Comparative Example 1 | First soft magnetic layer only | 6.68 | 5.37 | 0.80 |
| Comparative Example 2 | Second soft magnetic layers only | 176.04 | 61.77 | 0.35 |
| Example | First soft magnetic layer and second magnetic layers | 36.53 | 5.40 | 0.15 |

Tables 2 and 3 show magnetic field transmittance Px in the X direction, magnetic field transmittance Py in the Y direction and ratio Py/Px, wherein overlapping length D (See FIG. 1B) between first soft magnetic layer 3 and second soft magnetic layers 4A, 4B, as viewed in the Z direction, is taken as a parameter. Magnetic field transmittance Px in the X direction is the value when an external magnetic field of 10 mT is applied in the X direction, and magnetic field transmittance Py in the Y direction is the value when an external magnetic field of 10 mT is applied in the Y direction. When D is negative, first soft magnetic layer 3 does not overlap second soft magnetic layers 4A, 4B, and the space between first soft magnetic layer 3 and second soft magnetic layers 4A, 4B is indicated by the negative value of D. Table 2 shows where width W of second soft magnetic layers 4A, 4B (See FIG. 1B) is 12 μm, and Table 3 shows where width W of soft magnetic layers 4A, 4B is 24 μm.

TABLE 2

| | Overlapping length D (μm) | | | | | |
|---|---|---|---|---|---|---|
| | 6 | 4 | 2 | 0 | −2 | −4 |
| Px | 8.0 | 8.5 | 8.0 | 7.7 | 7.6 | 7.3 |
| Py | 4.9 | 5.7 | 5.7 | 5.1 | 5.0 | 4.9 |
| Py/Px | 0.62 | 0.67 | 0.72 | 0.66 | 0.66 | 0.68 |

TABLE 3

| | Overlapping length D (μm) | | | |
|---|---|---|---|---|
| | 8 | 4 | 0 | −4 |
| Px | 9.1 | 8.4 | 7.6 | 7.4 |
| Py | 4.5 | 4.8 | 4.4 | 4.5 |
| Py/Px | 0.50 | 0.57 | 0.58 | 0.61 |

As can be understood from Tables 2 and 3, whether or not overlap is present, and the magnitude of overlapping length D, do not make a significant difference in Py/Px, and may be appropriately chosen depending on other factors. Thus, a pair of second soft magnetic layers 4A, 4B may be spaced from first soft magnetic layer 3, as viewed in the Z direction. For example, the dimension of magnetic sensor 1 in the X direction can be shortened by increasing overlapping length D between first soft magnetic layer 3 and second soft magnetic layers 4A, 4B. If first soft magnetic layer 3 does not overlap second soft magnetic layers 4A, 4B, then a large area having small Bx will be secured on first soft magnetic layer 3, so that the area of magnetic field detecting element 2 will be increased in the X direction.

Second Embodiment

Figure 3A:
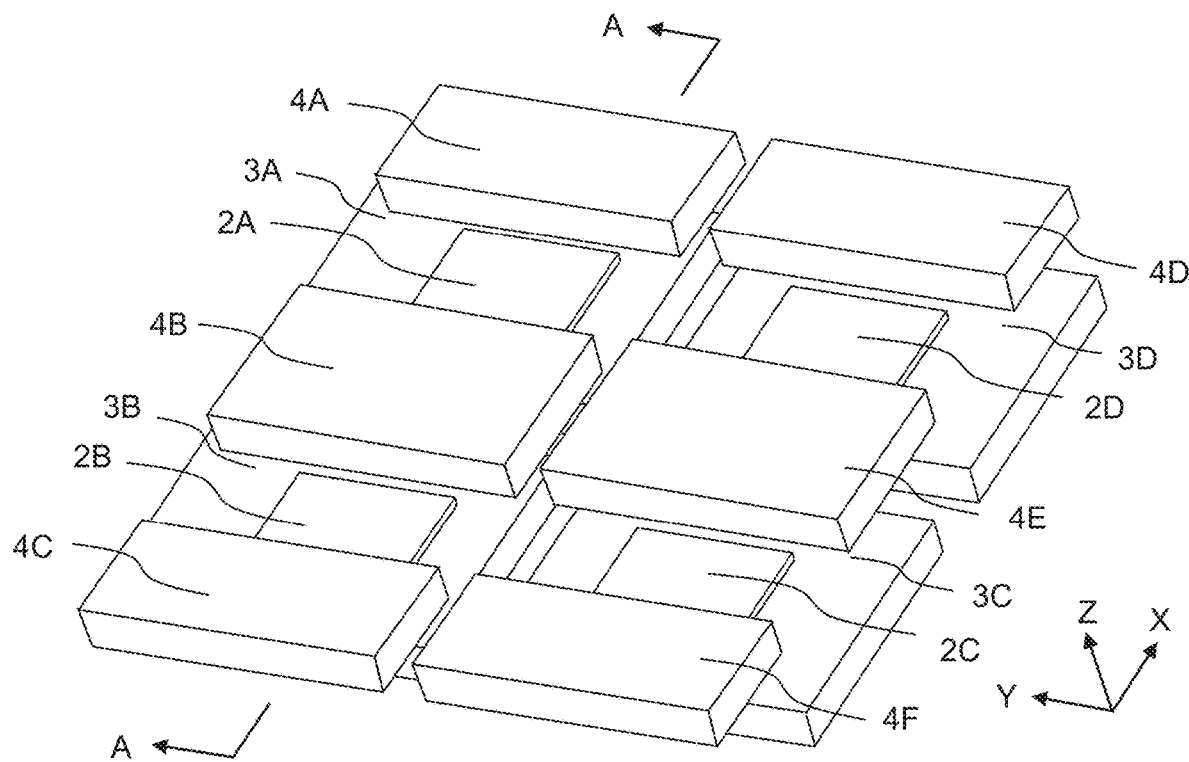
FIG. 3A is a conceptual perspective view of a magnetic sensor according to a second embodiment.
Figure 3B:
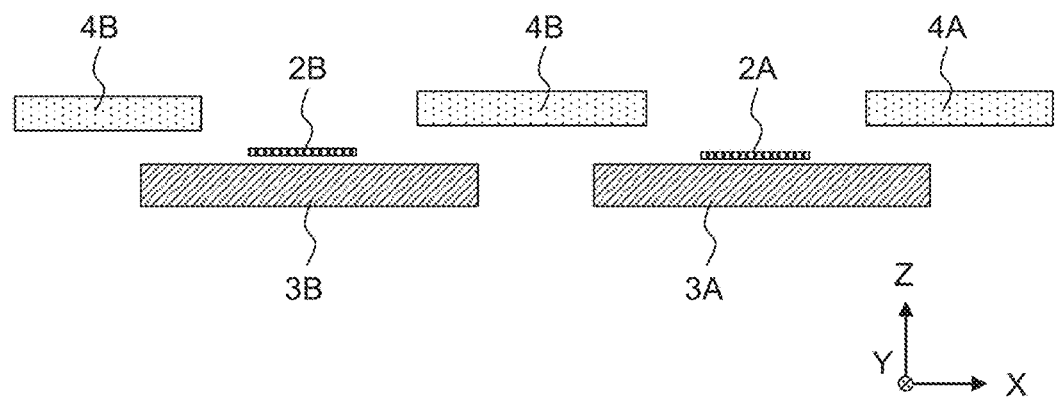
FIG. 3B is a sectional view taken along line A-A in FIG. 3A.
Figure 4A:
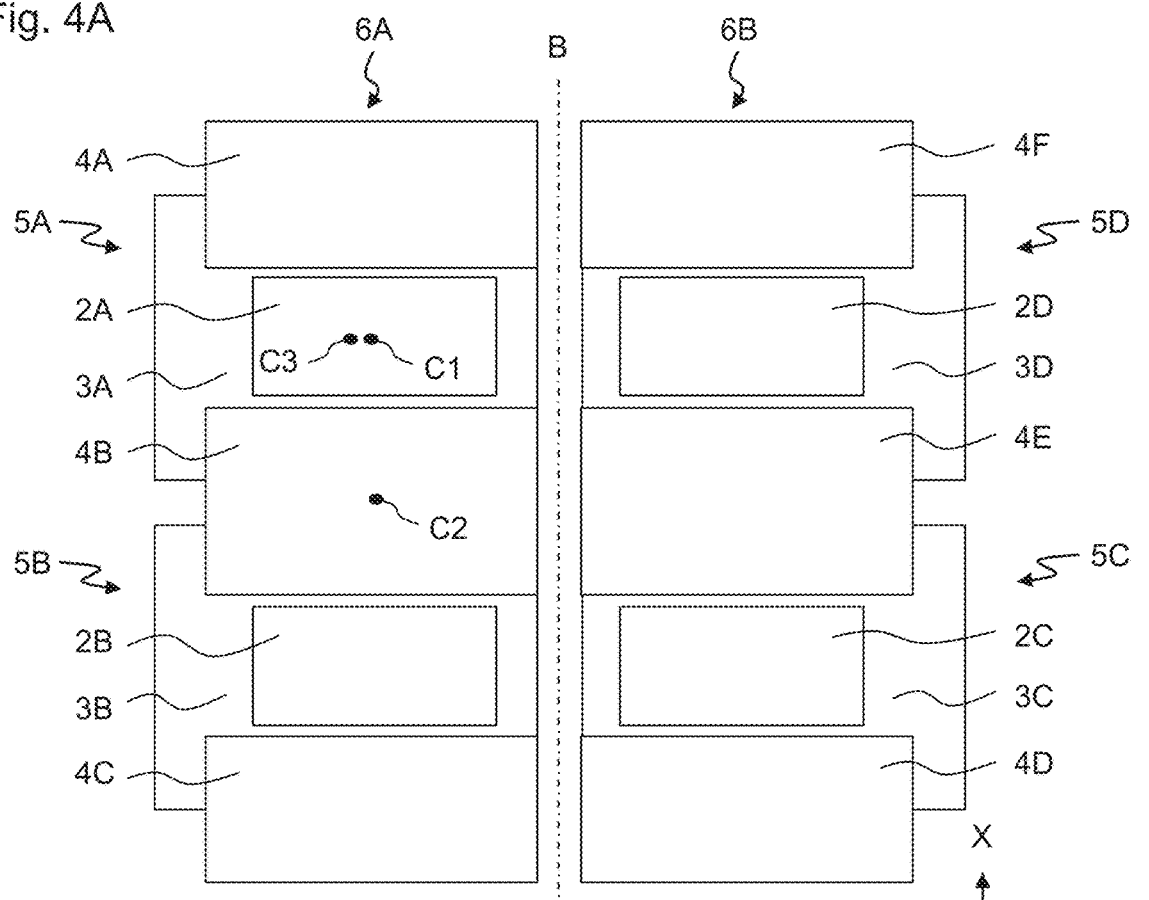
FIG. 4A is a conceptual plan view of the magnetic sensor according to the second embodiment.
Figure 4B:
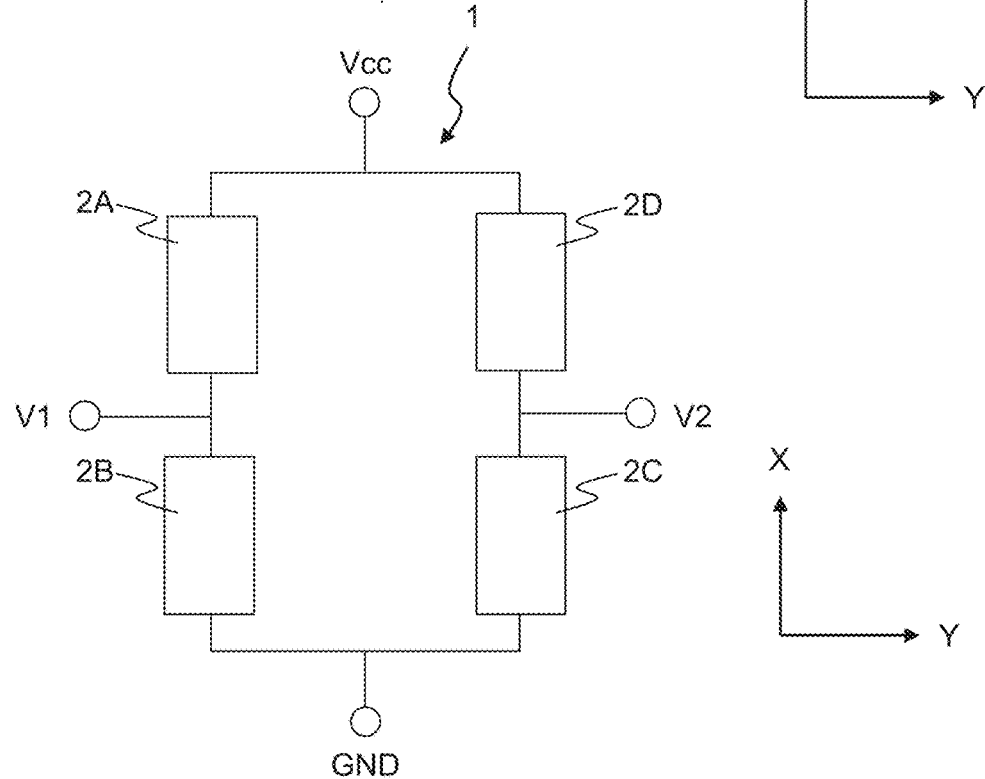
FIG. 4B is a diagram showing the conceptual circuit configuration of a magnetic sensor that corresponds to FIG. 4A.

FIGS. 3A, 3B are conceptual views of magnetic sensor 1 according to the second embodiment, wherein FIG. 3A shows a perspective view of magnetic sensor 1, and FIG. 3B shows a cross sectional view taken along line A-A in FIG. 3A. In the present embodiment, four magnetic field detecting elements (first to fourth magnetic field detecting elements 2A to 2D) are provided. FIG. 4A is a plan view of magnetic sensor 1, and FIG. 4B shows a conceptual circuit configuration of magnetic sensor 1 that corresponds to FIG. 4A. Magnetic field detecting elements 2A to 2D are interconnected in a bridge circuit (Wheatstone bridge). Four magnetic field detecting elements 2A to 2D are divided into two sets, that is, set 2A, 2B and set 2C, 2D. Magnetic field detecting element 2A and 2B of the set are connected in series, and magnetic field detecting elements 2C and 2D of the set are connected in series. One end of set 2A, 2B of the magnetic field detecting elements and one end of set 2C, 2D of the magnetic field detecting elements are connected to supply voltage Vcc, and the other ends are grounded (GND). Further, midpoint voltage V1 between first magnetic field detecting element 2A and second magnetic field detecting element 2B and midpoint voltage V2 between third magnetic field detecting element 2C and fourth magnetic field detecting element 2D are outputted. Therefore, midpoint voltages V1, V2 are determined as follows, where electric resistance of first to fourth magnetic field detecting elements 2A to 2D are R1 to R4, respectively.

$$V_1 = \frac{R_2}{R_1 + R_2} V_{cc} \quad \text{(Formula 1)}$$

$$V_2 = \frac{R_3}{R_3 + R_4} V_{cc} \quad \text{(Formula 2)}$$

By detecting difference V1-V2 between midpoint voltages V1 and V2, the sensitivity can be doubled as compared to detecting midpoint voltage V1 and V2. In addition, even when midpoint voltages V1, V2 are offset, the influence of the offset can be eliminated by detecting the difference.

Magnetic sensor 1 of the present embodiment has a plurality of sets 5A to 5D, each comprising a magnetic field detecting element, a first soft magnetic layer and a pair of second soft magnetic layers. First set 5A includes magnetic field detecting element 2A, first soft magnetic layer 3A and a pair of second soft magnetic layers 4A, 4B. Second set 5B includes magnetic field detecting element 2B, first soft magnetic layer 3B and a pair of second soft magnetic layers 4B, 4C. Third set 5C includes magnetic field detecting element 2C, first soft magnetic layer 3C and a pair of second soft magnetic layers 4D, 4E. Fourth set 5D includes magnetic field detecting element 2D, first soft magnetic layer 3D, and a pair of second soft magnetic layers 4E, 4F. First set 5A and second set 5B are adjacent to each other in the magnetic field detecting direction X so as to form first row 6A, and third set 5C and fourth set 5D are adjacent to each other in the magnetic field detecting direction X so as to form second row 6B. First row 6A and second row 6B are adjacent to each other in the Y direction that is perpendicular to the magnetic field detecting direction. Second soft magnetic layer 4B, which is one of the elements of first set 5A, is integral with second soft magnetic layer 4B, which is one of the elements of adjacent second set 5B. Similarly, second soft magnetic layer 4E, which is one of the elements of third set 5C, is integral with second soft magnetic layer 4E, which is one of the elements of adjacent fourth set 5D.

Figure 5A:
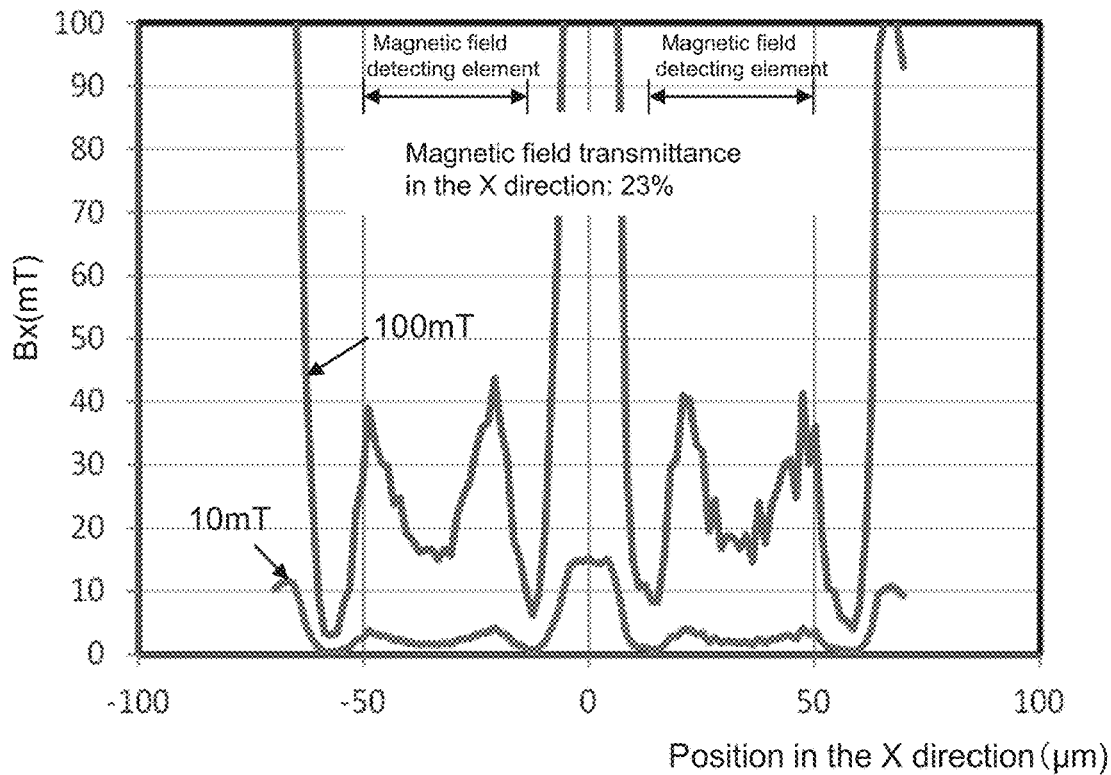
FIGS. 5A and 5B are examples of magnetic flux density when an external magnetic field is applied to the magnetic sensor shown in FIG. 4A.
Figure 5B:
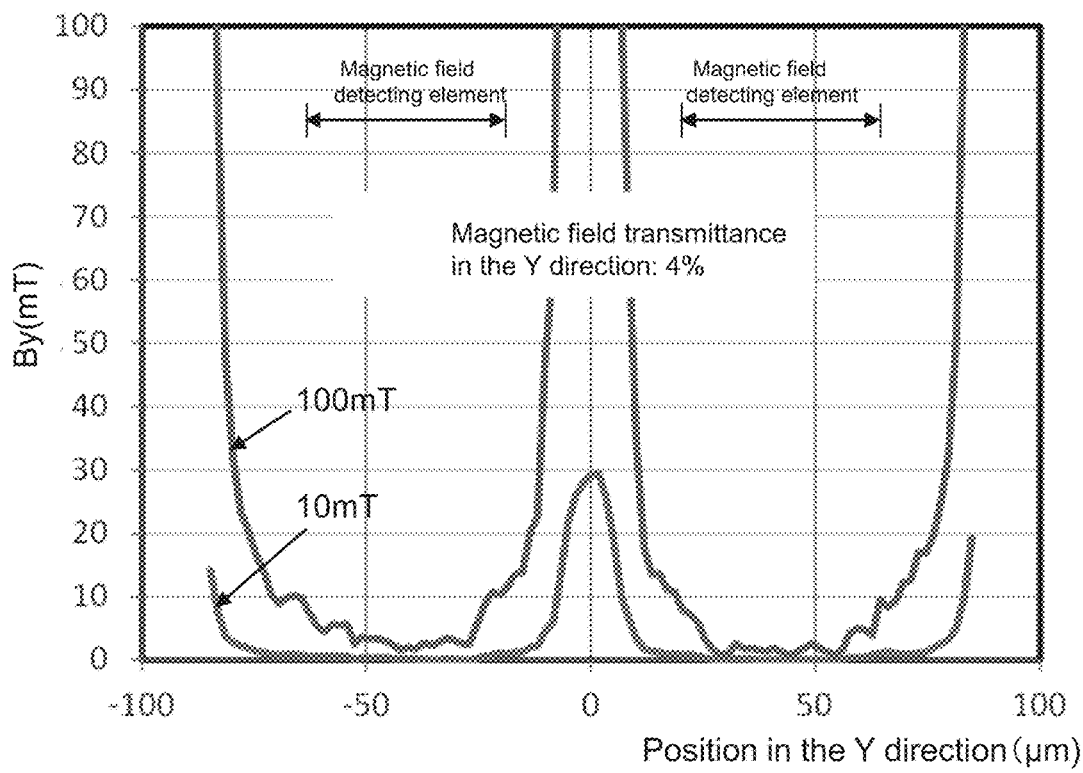

FIG. 5A shows magnetic flux density (Bx) when external magnetic fields having magnetic flux density of 10 mT and 100 mT are applied in the X direction, and FIG. 5B shows magnetic flux density (By) when external magnetic fields having magnetic flux density of 10 mT and 100 mT are applied in the Y direction. Bx and By are average values in the thickness direction (the Z direction) where magnetic field detecting elements 2A to 2D are arranged. Bx is large and By is small in the area of magnetic field detecting elements 2A to 2D. Both in the case of 10 mT and in the case of 100 mT, magnetic field transmittance Px in the X direction was 23%, magnetic field transmittance Py in the Y direction was 4%, and Py/Px was about 17%.

As viewed in the Z direction, centers C1 of magnetic field detecting elements 2A, 2B, 2C and 2D and centers C2 of second soft magnetic layers 4A to 4F of the sets are closer to boundary B between first row 6A and second row 6B than to centers C3 of first soft magnetic layers 3A, 3B, 3C and 3D, respectively. This makes it possible to limit the variation in Bx in the area of magnetic field detecting elements 2A to 2D. The variation in Bx in the area of magnetic field detecting elements 2A to 2D leads to variation in the outputs of MR elements that constitute magnetic field detecting elements 2A to 2D. As a result, the output of magnetic field detecting elements 2A to 2D are more likely to be affected by edges 7. The degree of freedom in designing magnetic field detecting elements 2A to 2D can be increased by limiting the variation.

Third Embodiment

Figure 6A:
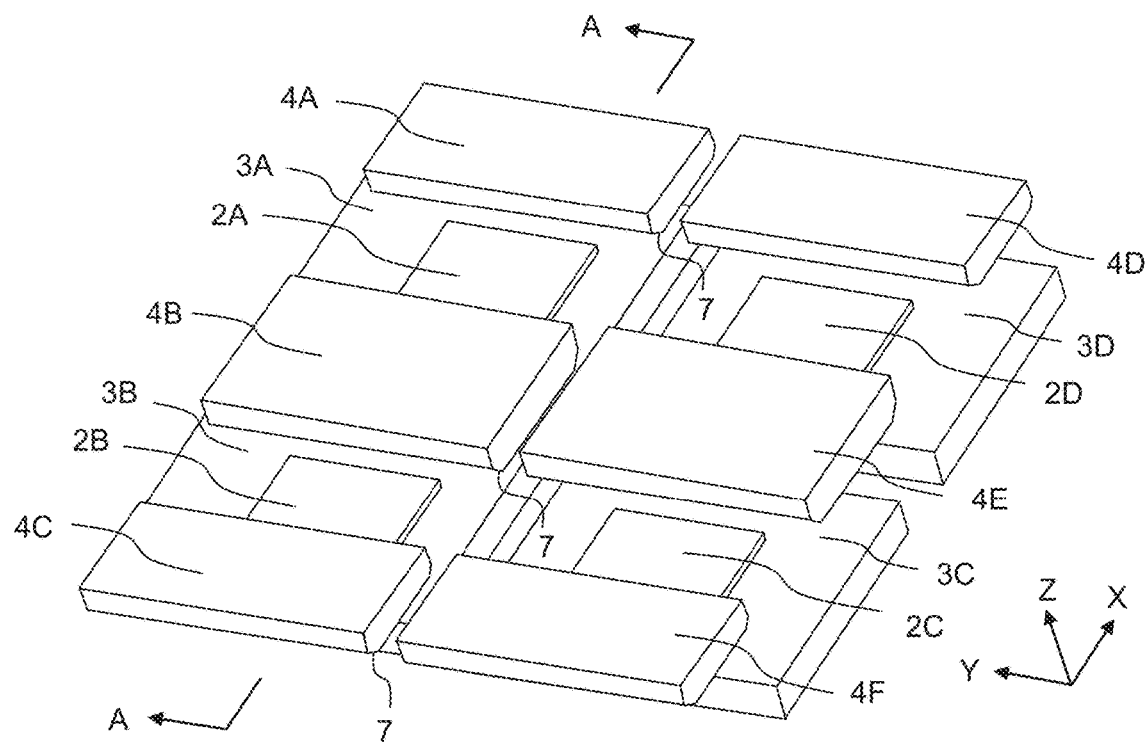
FIG. 6A a conceptual perspective view of a magnetic sensor according to a third embodiment.
Figure 6B:
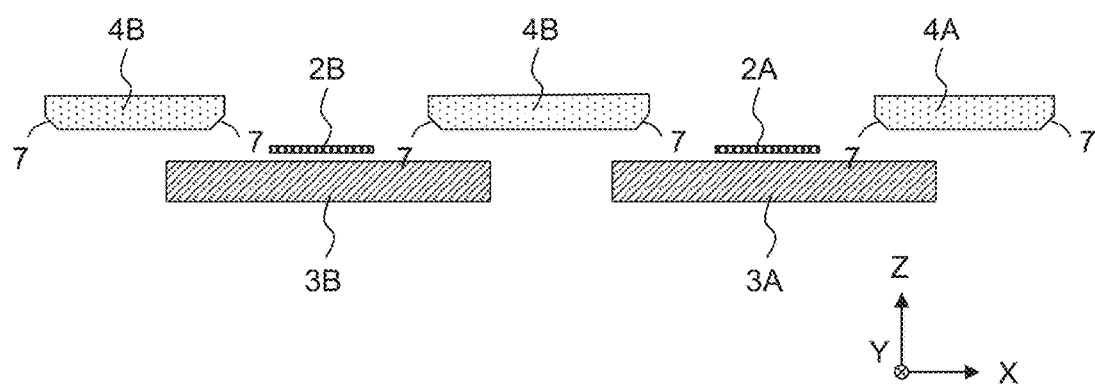
FIG. 6B is a sectional view taken along line A-A in FIG. 6A.
Figure 7:
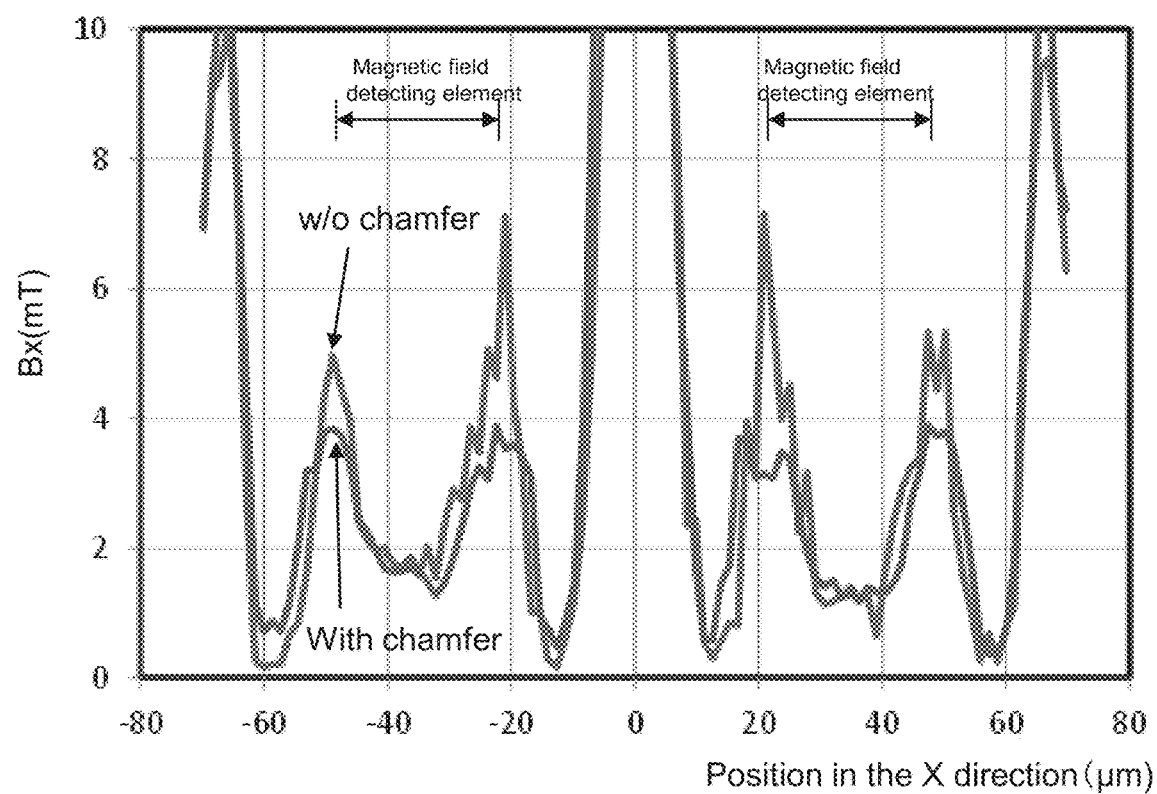
FIG. 7 is an example of magnetic flux density when an external magnetic field is applied to the magnetic sensor shown in FIG. 6A.

FIGS. 6A, 6B are conceptual views of magnetic sensor 1 according to the third embodiment, wherein FIG. 6A shows a perspective view of magnetic sensor 1, and FIG. 6B shows a cross sectional view taken along line A-A in FIG. 6A. The present embodiment is a modification of the second embodiment, but may also be applied to the first embodiment. Edges 7 of second soft magnetic layers 4A to 4F that face first soft magnetic layers 3 are chamfered. FIG. 7 shows magnetic flux density (Bx) when an external magnetic field having magnetic flux density of 10 mT is applied in the X direction. When no chamfer is formed, peaks of Bx are observed near the ends of the area of magnetic field detecting element 2 in the X direction (substantially corresponds to edges 7 of second soft magnetic layers 4A to 4F). Since magnetic flux concentrates at sharp edges 7, magnetic flux density increases in the vicinity of the edges. As a result, the magnitude of Bx varies in the area of magnetic field detecting elements 2A to 2D. Chamfering edges 7 reduces the magnetic flux density at edges 7 of second soft magnetic layers 4A to 4F, as illustrated, and further levels the magnitude of Bx in the area of magnetic field detecting elements 2A to 2D. As a result, the effects that are mentioned in the second embodiment are further enhanced.

As described above, in each embodiment mentioned above, first soft magnetic layer 3 (or 3A to 3D) and second soft magnetic layers 4A, 4B (or 4A to 4F) are arranged at different levels. This increases the flexibility in the arrangement of first soft magnetic layer 3 and second soft magnetic layers 4A, 4B. For example, by adjusting overlapping length D in the X direction between first soft magnetic layer 3 and second soft magnetic layers 4A, 4B or by adjusting dimension H of gap G2 in the Z direction between first soft magnetic layer 3 and second soft magnetic layers 4A, 4B (see FIG. 1B), the performance of collecting magnetic flux of second soft magnetic layers 4A, 4B, that function as yolks, can be adjusted. Table 4 shows average magnetic field transmittance in the X direction for various dimensions H of gap G2 in the area of magnetic field detecting element 2. Gap G1 between magnetic field detecting element 2 and first soft magnetic layer 3 is 1 μm. The average magnetic field transmittance can be adjusted by changing dimension H of gap G2. In general, the sensitivity of magnetic sensor 1 increases in accordance with the increase in the average magnetic field transmittance, but the signal magnetic field may conversely have to be reduced when the signal magnetic field is large. Thus, in each embodiment mentioned above, it is easy to adjust the average magnetic field transmittance.

TABLE 4

| | Dimension H of gap G2 (μm) | | |
|---|---|---|---|
| | 1 | 2 | 3 |
| Average magnetic field transmittance (%) | 11.9 | 13.6 | 14.2 |

In each embodiment mentioned above, one first soft magnetic layer 3 is combined with one magnetic field detecting element 2. First soft magnetic layer 3 is sized to cover magnetic field detecting element 2, as viewed in the Z direction, and is less affected by manufacturing errors. Therefore, the yield of magnetic sensor 1 can be improved. Since the shape of first soft magnetic layer 3 is not particularly limited, it is possible to employ first soft magnetic layer 3 having optimum shape and size that match the design of magnetic field detecting element 2.

The shape of second soft magnetic layers 4A, 4B is not limited, either. For example, when second soft magnetic layers 4A, 4B are elongate in the Y direction, the magnetization of second soft magnetic layers 4A, 4B tends to be saturated in the Y direction. Since the aspect ratio of second soft magnetic layers 4A, 4B, as viewed in the Z direction, is not limited in the present embodiments, it is possible to employ second soft magnetic layers 4A, 4B having an optimum shape.

The present invention is not limited to the above-mentioned embodiments. For example, magnetic field detecting element 2 may overlap either or both of second soft magnetic layers 4A, 4B, as viewed in the Z direction. In the second and third embodiments, four magnetic field detecting elements 2 that constitute a bridge circuit may be arranged in a row. In other words, at least some of sets 5A to 5D may are adjacent to each other in the magnetic field detecting direction.

Although certain preferred embodiments of the present invention have been shown and described in detail, it should be understood that various changes and modifications may be made without departing from the spirit or scope of the appended claims.

What is claimed is:

1. A magnetic sensor comprising a plurality of sets, wherein each set comprises a magnetic field detecting element, a first soft magnetic layer and a pair of second soft magnetic layers, and the magnetic field detecting elements of the sets constitute a bridge circuit, and in each set,
the pair of second soft magnetic layers is positioned at a location that is different from the first soft magnetic layer in a thickness direction of the first soft magnetic layer, wherein the thickness direction is a direction in which the first soft magnetic layer has a thinnest thickness,
the magnetic field detecting element is positioned between the first soft magnetic layer and the second soft magnetic layers in the thickness direction, wherein the magnetic field detecting element has a magnetic field detecting direction that is parallel to a direction in which the pair of the second soft magnetic layers is arranged, and
as viewed in the thickness direction, the second soft magnetic layers are positioned on both sides of a center of the first soft magnetic layer, and
at least some of the sets are adjacent to each other in the magnetic field detecting direction, and one of the second soft magnetic layers of one of adjacent sets is integral with one of the second soft magnetic layers of the remaining adjacent set.

2. The magnetic sensor according to claim 1, wherein at least a part of the magnetic field detecting element is positioned between the second soft magnetic layers, as viewed in the thickness direction.

3. The magnetic sensor according to claim 1, wherein the pair of the second soft magnetic layers overlaps the first soft magnetic layer, as viewed in the thickness direction.

4. The magnetic sensor according to claim 1, wherein the pair of the second soft magnetic layers is spaced from the first soft magnetic layer, as viewed in the thickness direction.

5. The magnetic sensor according to claim 1, wherein an edge of the second soft magnetic layer that faces the first soft magnetic layer is chamfered.

6. The magnetic sensor according to claim 1, wherein the plurality of sets is four sets, wherein two of the four sets are adjacent to each other in the magnetic field detecting direction so as to form a first row, and remaining two of the four sets are adjacent to each other in the magnetic field detecting direction so as to form a second row, the first row and the second row are adjacent to each other in a direction that is perpendicular to the magnetic field detecting direction, and a center of the magnetic field detecting element and centers of the second soft magnetic layers of each set are closer to a boundary between the first row and the second row than a center of the first soft magnetic layer, as viewed in the thickness direction.

7. The magnetic sensor according to claim 1, wherein the magnetic field detecting element has a TMR element.

8. The magnetic sensor according to claim 1, wherein the magnetic field detecting element is positioned inside of a periphery of the first soft magnetic layer.

9. The magnetic sensor according to claim 1, wherein a region where the magnetic field detecting element is positioned corresponds to a central portion of the first soft magnetic layer in the direction in which the pair of the second soft magnetic layers is arranged.

10. The magnetic sensor according to claim 1, wherein the region where the magnetic field detecting element is positioned is only between adjacent ends of the pair of the second soft magnetic layers, as viewed in the thickness direction.

11. The magnetic sensor according to claim 1, wherein the magnetic field detecting element faces only the central portion of the first soft magnetic layer.

* * * * *